United States Patent
Choi et al.

(10) Patent No.: US 10,606,383 B2
(45) Date of Patent: Mar. 31, 2020

(54) TOUCH SENSOR COMPRISING MESH PATTERN

(71) Applicant: DONGWOO FINE-CHEM CO., LTD., Jeollabuk-do (KR)

(72) Inventors: Byung Jin Choi, Gyeonggi-do (KR); Dong Pil Park, Incheon (KR); Jae Hyun Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 38 days.

(21) Appl. No.: 15/716,731

(22) Filed: Sep. 27, 2017

(65) Prior Publication Data
US 2018/0018034 A1    Jan. 18, 2018

Related U.S. Application Data

(63) Continuation of application No. PCT/KR2016/000619, filed on Jan. 21, 2016.

(30) Foreign Application Priority Data

Mar. 30, 2015    (KR) .................. 10-2015-0044293

(51) Int. Cl.
*G06F 3/041* (2006.01)
*G06F 3/044* (2006.01)
(Continued)

(52) U.S. Cl.
CPC ............ *G06F 3/041* (2013.01); *G06F 1/1692* (2013.01); *G06F 3/044* (2013.01); *H01B 5/14* (2013.01);
(Continued)

(58) Field of Classification Search
CPC ......... G06F 3/041; G06F 3/045; G01R 27/26; G06K 11/06; G08C 21/00
See application file for complete search history.

(56) References Cited

U.S. PATENT DOCUMENTS 8,586,874 B2 * 11/2013 Kuriki .................... G06F 3/044
                                                    174/261
8,928,601 B2 *  1/2015 Lee ........................ G06F 3/041
                                                    178/18.03
(Continued)

FOREIGN PATENT DOCUMENTS

CN     102053751 A    5/2011
CN     103384870 A   11/2013
(Continued)

OTHER PUBLICATIONS

International Search Report for PCT/KR2016/000619.
(Continued)

*Primary Examiner* — Pegeman Karimi
(74) *Attorney, Agent, or Firm* — The PL Law Group, PLLC

(57) ABSTRACT

A touch sensor includes a sensing pattern which includes a first mesh pattern formed in a first direction and a second mesh pattern formed in a second direction, the second mesh pattern including isolated unit patterns, a bridge electrode connecting the neighboring isolated unit patterns of the second mesh patterns, an insulation layer disposed between the sensing pattern and the bridge electrodes, and an auxiliary mesh pattern disposed on or below at least one of the first mesh pattern and the second mesh pattern, the auxiliary mesh pattern being connected to at least one of the first mesh pattern and the second mesh pattern.

13 Claims, 3 Drawing Sheets

(51) Int. Cl.
*G06F 1/16* (2006.01)
*H01B 5/14* (2006.01)
*H03K 17/96* (2006.01)

(52) U.S. Cl.
CPC . *H03K 17/962* (2013.01); *G06F 2203/04103* (2013.01); *G06F 2203/04111* (2013.01); *G06F 2203/04112* (2013.01); *H03K 2017/9602* (2013.01); *H03K 2017/9613* (2013.01); *H03K 2217/96075* (2013.01); *H03K 2217/960755* (2013.01)

(56) References Cited

U.S. PATENT DOCUMENTS

| | | | | |
|---|---|---|---|---|
| 8,994,680 | B2* | 3/2015 | Lai | G06F 3/041 178/18.01 |
| 2004/0239861 | A1* | 12/2004 | Uchida | G02F 1/134309 349/149 |
| 2011/0290631 | A1* | 12/2011 | Kuriki | G06F 3/044 200/600 |
| 2014/0078068 | A1* | 3/2014 | Jones | G06F 3/044 345/173 |
| 2014/0238730 | A1* | 8/2014 | Nakamura | B32B 15/14 174/253 |
| 2015/0185903 | A1* | 7/2015 | Park | G06F 3/044 345/173 |
| 2016/0103517 | A1* | 4/2016 | Kang | G06F 3/044 345/174 |
| 2016/0378241 | A1* | 12/2016 | Park | G03F 7/0002 345/173 |
| 2017/0351131 | A1* | 12/2017 | Oem | G06F 3/044 |

FOREIGN PATENT DOCUMENTS

| | | |
|---|---|---|
| CN | 103907082 A | 7/2014 |
| CN | 103984458 A | 8/2014 |
| CN | 103999024 A | 8/2014 |
| CN | 203966088 U | 11/2014 |
| CN | 104380225 A | 2/2015 |
| CN | 104423682 A | 3/2015 |
| JP | 2011-248722 A | 12/2011 |
| KR | 10-2013-0069938 A | 6/2013 |
| KR | 10-2013-0074933 A | 7/2013 |
| KR | 10-1472961 B1 | 12/2014 |
| KR | 10-2015-0006228 A | 1/2015 |
| TW | 201333794 A1 | 8/2013 |
| TW | 201432527 A | 8/2014 |
| WO | WO 2012/047014 A2 | 4/2012 |

OTHER PUBLICATIONS

Office action dated Oct. 25, 2019 from China Patent Office in a counterpart China Patent Application No. 201680019596.7 (English translation is also submitted herewith.).

* cited by examiner

TOUCH SENSOR COMPRISING MESH PATTERN

CROSS-REFERENCE TO RELATED APPLICATION AND CLAIM OF PRIORITY

This application is a continuation application to International Application No. PCT/KR2016/000619, filed Jan. 21, 2016 which claims priority to Korean Patent Applications No. 10-2015-0044293 filed on Mar. 30, 2015 in the Korean Intellectual Property Office (KIPO), the entire disclosure of which is incorporated by reference herein.

BACKGROUND

1. Field

The present invention relates to a touch sensor.

2. Description of the Related Art

As a computer using digital techniques has been developed, auxiliary devices of the computer are also being developed together. Personal computers, portable transmission devices, other private information processing devices, etc., perform text and graphic processing using a variety of input devices such as a keyboard and a mouse.

Recently, as transition into an information-oriented society is rapidly progressing, an application of the computer is gradually enlarged. However, there is a difficulty to efficiently drive computer-related products by using only a keyboard and a mouse, which currently serve as the input device. Therefore, a demand for a device capable of simply operating with reduced malfunction, and easily inputting information by anyone becomes higher.

Further, interests in the technique relating to the input device turn into high reliability, durability, innovativeness, design and processing-related techniques, or the like, beyond the level of satisfying general functions. For the purpose of achieving the interests, a touch sensor has been developed as an input device capable of inputting information such as texts, and graphics, etc.

The above-described touch sensor is a device which is installed on a display surface of an electronic notepad, a flat panel display device such as a liquid crystal display (LCD) device, a plasma display panel (PDP) or electroluminescence (EL) device, or an image display device such as a cathode ray tube (CRT), and is used to allow a user so as to select and input required information while viewing an image displayed on the image display device.

Types of the touch sensor are divided into a resistive type, a capacitive type, an electro-magnetic type, a surface acoustic wave (SAW) type, and an infrared type depending on a driving method thereof. Such various types of the touch sensor are employed in electronic products in consideration of a signal amplification, a difference in resolution, a difficulty in design and processing techniques, optical properties, electrical properties, mechanical properties, environment-resistant characteristics, input characteristics, durability and economic feasibility. Currently, the capacitive-type touch sensor is highlighted widely as an input device satisfying the above-described requirements.

Meanwhile, in order to reduce visibility of electrode patterns formed on the touch sensor, as disclosed in Japanese Patent Laid-Open Publication No. 2011-248722, various methods have been proposed in the related art. The above patent discloses a method of controlling an angle or a shape with respect to a portion at which the electrode patterns are overlapped with each other in a touch sensor, thereby reducing the electrode patterns from being viewed by the user, to improve visibility of the touch sensor. However, in relation to a change of such a shape of the touch sensor, there are various problems related to the visibility of the electrode patterns such as an occurrence of moiré due to a combination of regular shapes, as well as a structural limitation in the shape of the portion.

SUMMARY

According to an aspect of the present invention, there is provided a touch sensor with reduced moiré phenomenon.

According to an aspect of the present invention, there is provided a touch sensor with improved touch sensitivity.

According to an aspect of the present invention, there is provided a touch sensor capable of preventing a sensing pattern from being viewed by a user.

The above aspects of the present inventive concepts will be achieved by the following features or characteristics:

(1) A touch sensor comprising: sensing patterns which include first mesh patterns formed in a first direction and second mesh patterns formed in a second direction, the second mesh patterns including isolated unit patterns; a bridge electrode connecting the neighboring isolated unit patterns of the second mesh patterns; an insulation layer disposed between the sensing pattern and the bridge electrode; and an auxiliary mesh pattern disposed on an upper side or a lower side of at least one of the first mesh pattern and the second mesh pattern, the auxiliary mesh pattern being connected to at least one of the first mesh pattern and the second mesh pattern.

(2) The touch sensor according to the above (1), wherein the sensing pattern includes at least one selected from the group consisting of molybdenum, silver, aluminum, copper, palladium, gold, platinum, zinc, tin, titanium, chromium, nickel, tungsten, an alloy thereof, indium-tin oxide (ITO), indium-zinc oxide (IZO), zinc oxide (ZnO), indium-zinc-tin oxide (IZTO), cadmium-tin oxide (CTO), copper oxide (CO), poly(3,4-ethylenedioxythiophene) (PEDOT), carbon nanotube (CNT) and graphene.

(3) The touch sensor according to the above (1), wherein the sensing pattern has a thickness of 10 to 350 nm.

(4) The touch sensor according to the above (1), wherein the bridge electrode includes at least one selected from the group consisting of molybdenum, silver, aluminum, copper, palladium, gold, platinum, zinc, tin, titanium, chromium, nickel, tungsten, an alloy thereof, indium-tin oxide (ITO), indium-zinc oxide (IZO), zinc oxide (ZnO), indium-zinc-tin oxide (IZTO), cadmium-tin oxide (CTO), copper oxide (CO), poly(3,4-ethylenedioxythiophene) (PEDOT), carbon nanotube (CNT) and graphene.

(5) The touch sensor according to the above (1), wherein the auxiliary mesh pattern and the bridge electrode are disposed on the same side based on the sensing pattern.

(6) The touch sensor according to the above (5), wherein the auxiliary mesh pattern and the bridge electrode are formed of the same material simultaneously in a single process.

(7) The touch sensor according to the above (1), wherein the bridge electrode has a mesh structure.

(8) The touch sensor according to the above (1), wherein the bridge electrode includes an opening.

(9) The touch sensor according to the above (1), wherein the bridge electrode includes two or more bridges.

(10) The touch sensor according to the above (1), wherein the insulation layer has a continuous layer shape, and the auxiliary mesh pattern is connected with the sensing pattern through a contact hole formed in the insulation layer.

(11) The touch sensor according to the above (1), wherein the insulation layer has an island shape selectively formed at an intersection region of the sensing pattern and the bridge electrode, and the auxiliary mesh pattern is directly connected to at least one of the first mesh pattern and the second mesh pattern.

(12) The touch sensor according to the above (1), wherein the auxiliary mesh pattern includes a first auxiliary mesh pattern and a second auxiliary mesh pattern, wherein the first auxiliary mesh pattern is disposed on an upper side or a lower side of the first mesh pattern to be connected to the first mesh pattern, and the second auxiliary mesh pattern is disposed on an upper side or a lower side of the second mesh pattern to be connected to the second mesh pattern.

(13) The touch sensor according to the above (12), wherein the first auxiliary mesh pattern and the second mesh pattern are insulated from each other.

(14) The touch sensor according to the above (12), wherein a plurality of the second auxiliary mesh pattern are connected with each other through the bridge electrode.

(15) A touch sensor comprising: a substrate; sensing patterns which include first mesh patterns formed on the substrate in a first direction and second mesh patterns formed on the substrate in a second direction, the second mesh patterns including isolated unit patterns; a bridge electrode connecting the neighboring isolated unit patterns of the second mesh patterns; an insulation layer disposed between the sensing pattern and the bridge electrode; and an auxiliary mesh pattern disposed on the same side as that of the bridge electrode based on the sensing patterns, the auxiliary mesh pattern being connected to at least one of the first mesh pattern and the second mesh pattern.

(16) The touch sensor according to the above (15), wherein the auxiliary mesh pattern and the bridge electrode are formed of the same material simultaneously in a single process.

According to the touch sensor of the present inventive concepts, a moiré phenomenon may be prevented from being recognized by the user Additionally, according to the touch sensor of the present inventive concepts, even though the sensing pattern is disconnected, touch contact signals may be transferred by the auxiliary mesh patterns, and thus the touch sensitivity may be remarkably improved.

Further, according to the touch sensor of the present inventive concepts, the sensing patterns may be formed in a thinner thickness, and thus the sensing patterns may be prevented from being viewed by the user.

BRIEF DESCRIPTION OF THE DRAWINGS

The above and other aspects, objects, features and other advantages of the present invention will be more clearly understood from the following detailed description taken in conjunction with the accompanying drawings, in which.

DETAILED DESCRIPTIONS

Figure 1:
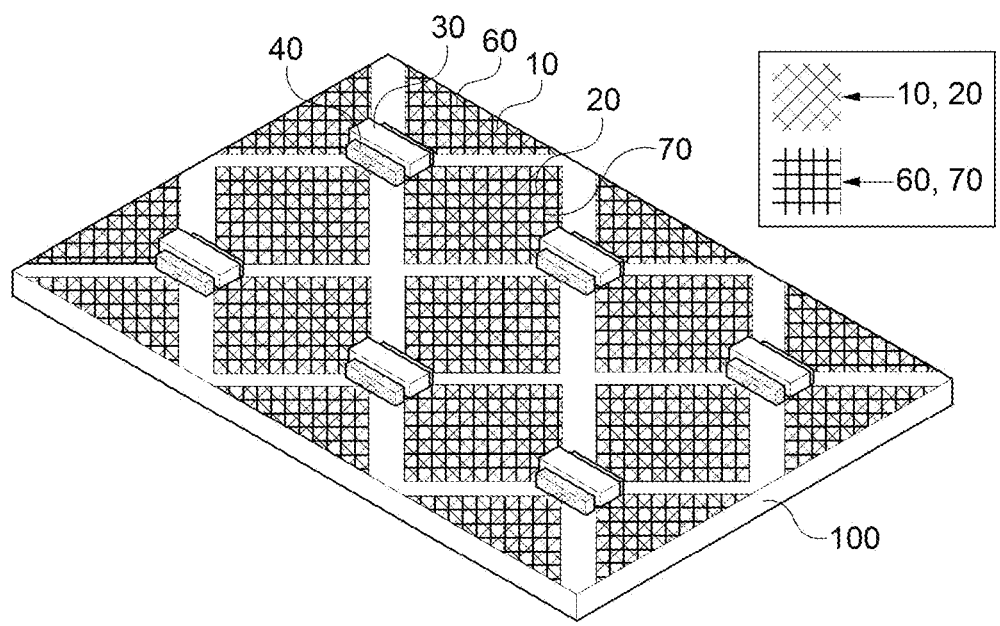
FIG. 1 is a schematic perspective view of a touch sensor according to one embodiment of the present invention.

According to an embodiment of the present invention, a touch sensor includes sensing patterns which include first mesh patterns formed in a first direction and second mesh patterns formed in a second direction; bridge electrodes configured to connect isolated unit patterns of the second mesh patterns; an insulation layer disposed between the sensing pattern and the bridge electrode; and an auxiliary mesh pattern which is positioned on an upper side or a lower side of at least one of the first mesh pattern and the second mesh pattern, and is connected to at least one of the first mesh pattern and the second mesh pattern. In the touch sensor according to an embodiment of the present invention, touch sensitivity may be improved, the sensing pattern may be prevented from being viewed by a user, and moiré phenomenon may be prevented from being recognized by the user.

The size and thickness of each element are arbitrarily shown in the drawings, and the present invention is not necessarily limited thereto.

In the drawings, the thickness of layers, films, panels, regions, patterns, etc., are exaggerated for clarity. Also, in the drawings, the thickness of some layers and regions are exaggerated for the sake of brevity. It will be understood that when an element such as a layer, film, region, or substrate is referred to as being "on" or "below" another element, it can be directly on the other element or intervening elements may also be present.

Hereinafter, some exemplary embodiments of the present inventive concepts will be provided with accompanying drawings. However, these embodiments are only given for illustrating the present inventive concepts, and are not to be construed as limiting the scope of the present invention.

A touch sensor of the present inventive concepts includes sensing patterns, a bridge electrode 30, an insulation layer 40 and auxiliary mesh pattern.

The sensing patterns may include a first mesh pattern 10 formed in a first direction and a second mesh pattern 20 formed in a second direction.

In example embodiments, a plurality of the first mesh patterns 10 and the second mesh patterns 20 may be arranged along different directions from each other. For example, the first direction may be an X-axis direction, and the second direction may be a Y-axis direction orthogonal to the first direction.

The first mesh pattern 10 and the second mesh pattern 20 may be configured to provide information on X coordinate and Y coordinate of a touched point, respectively. For example, when a user touches a point on a cover window substrate with a finger or an individual tool, information of the touched point may be detected and transferred to a driving circuit via the first mesh pattern 10, the second mesh pattern 20 and a position detecting line as a change in capacitance depending on a contact position. The change in capacitance may be converted to an electrical signal by X and Y input processing circuits (not illustrated), to identify the contact position.

In the configuration and implementation as mentioned above, the first and second mesh patterns 10 and 20 may be formed on the same layer, and the respective patterns are electrically connected with each other to detect the touched point. The first mesh patterns 10 may be connected with each other while the second mesh patterns 20 may be separated from each other in an island form. Thus, an additional bridge electrode 30 may be formed to electrically connect the second mesh patterns 20 with each other. The bridge electrode 30 will be described below.

In example embodiments, a form of the mesh structure may not be particularly limited. For example, a rectangular mesh structure, a rhombic mesh structure, a hexagonal mesh structure, or the like may be employed. In each structure, the mesh pattern may have a long side length of, for example, 2 to 500 µm, and the long side length may be appropriately adjusted within the above range in consideration of electrical conductivity, transmittance, or the like.

A width of the mesh pattern is not particularly limited and may be, for example, 1 to 30 µm, and preferably, 1 to 20 µm. When a metal mesh pattern has a width of 1 to 30 µm, visibility of patterns may be reduced while maintaining a proper electrical resistance.

A thickness of the sensing pattern is not particularly limited, for example, may be 10 to 350 nm. If the thickness of the sensing pattern is less than 10 nm, the electrical resistance may be increased to reduce touch sensitivity, and if the thickness exceeds 350 nm, a reflectivity may be increased to cause problems entailed in the visibility of patterns.

The sensing pattern may be formed of a material having excellent electric conductivity and low resistance, for example, molybdenum, silver, aluminum, copper, palladium, gold, platinum, zinc, tin, titanium, chromium, nickel, tungsten or an alloy thereof.

A transparent electrode material known in the related art may also be used for the sensing pattern. For example, indium-tin oxide (ITO), indium-zinc oxide (IZO), zinc oxide (ZnO), indium-zinc-tin oxide (IZTO), cadmium-tin oxide (CTO), copper Oxide (CO), poly(3,4-ethylenedioxythiophene) (PEDOT), carbon nanotube (CNT), graphene, etc., may be used.

The sensing pattern may be formed by, for example, various thin film deposition techniques such as a physical vapor deposition (PVD), a chemical vapor deposition (CVD), or the like. For example, the sensing pattern may be formed by a reactive sputtering which is an example of the physical vapor deposition.

The sensing pattern may be also formed by a printing process. For example, a gravure offset printing, a reverse offset printing, an inkjet printing, a screen printing, a gravure printing, or the like may be performed to form the sensing pattern. The sensing pattern may also be formed by a photolithography process.

The bridge electrode 30 may connect isolated unit patterns of the second mesh pattern 20. In this case, the bridge electrode 30 may be insulated from the first mesh patterns 10 of the sensing patterns, and the insulation layer 40 may be formed as described below.

Any transparent electrode material known in the related art may be used for the bridge electrode 30 without particular limitation thereof. For example, indium-tin oxide (ITO), indium-zinc oxide (IZO), zinc oxide (ZnO), indium-zinc-tin oxide (IZTO), cadmium-tin oxide (CTO), poly(3,4-ethylenedioxythiophene) (PEDOT), carbon nanotube (CNT), graphene, etc., may be used. These may be used alone or in a combination thereof. Preferably, the indium-tin oxide (ITO) may be used.

A metal having excellent electric conductivity and low resistance may be also for the bridge electrode 30. For example, molybdenum, silver, aluminum, copper, palladium, gold, platinum, zinc, tin, titanium, chromium, nickel, tungsten or an alloy thereof may be used.

A size or a dimension of the bridge electrode 30 is not particularly limited. For example, a long side of the bridge electrode 30 may have has a length of 2 to 500 µm, and preferably, 2 to 300 µm. When the long side of the bridge electrode 30 has a length of 2 to 500 µm, visibility of patterns may be reduced while maintaining a proper electrical resistance.

The bridge electrode 30 may include, for example, a bar structure.

Figure 2:
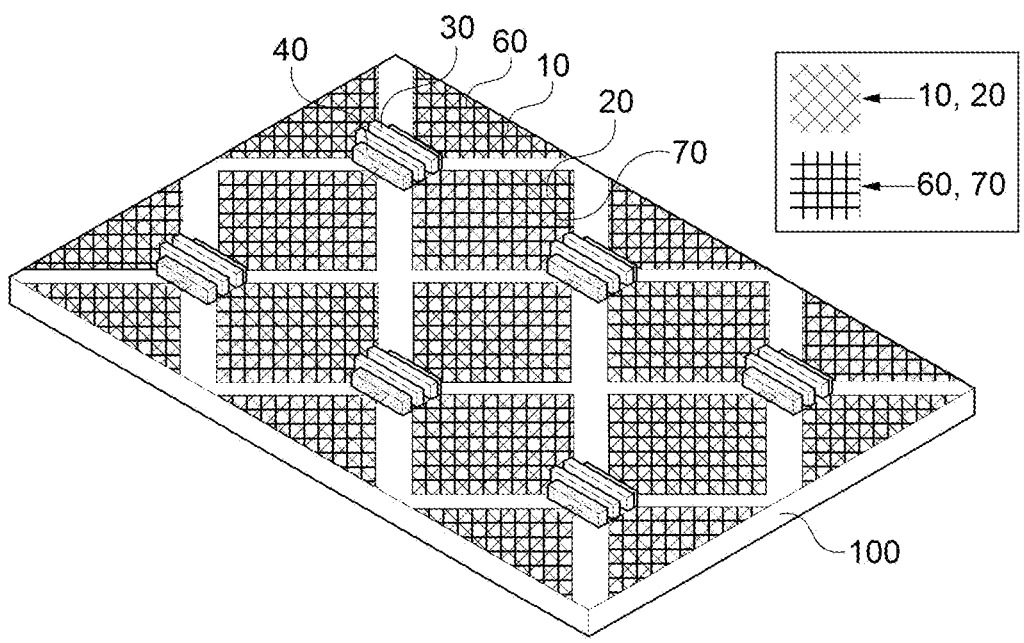
FIG. 2 is a schematic perspective view of a touch sensor according to one embodiment of the present invention.

The bridge electrode 30 may include, for example, a single bridge as illustrated in FIG. 1, and may include two or more bridges as illustrated in FIG. 2. When the bridge electrode 30 has two or more bridges, properties relating to resistance and visibility may be further enhanced.

Figure 3:
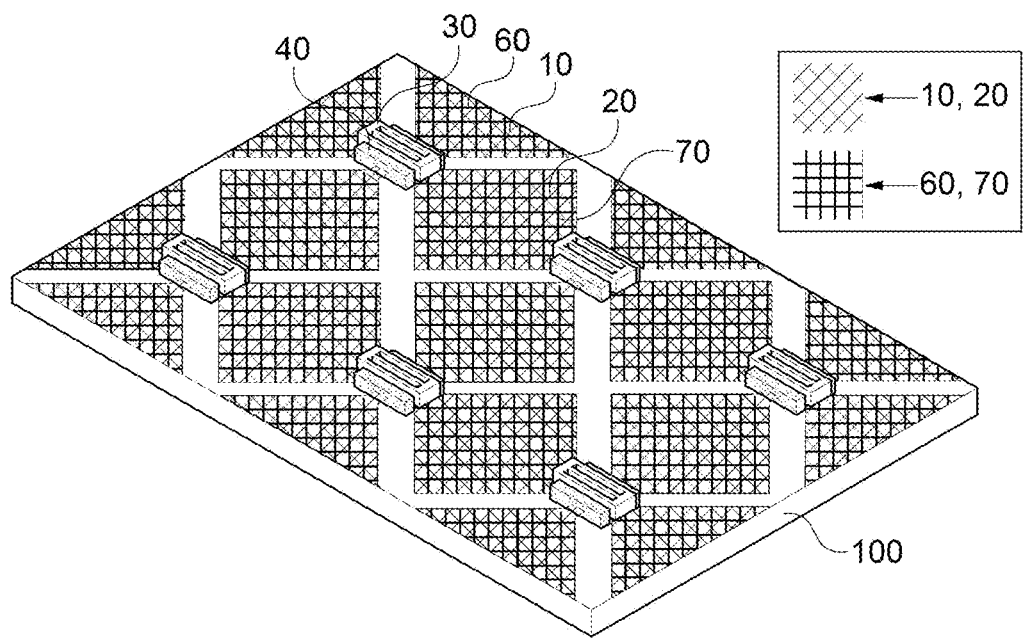
FIG. 3 is a schematic perspective view of a touch sensor according to one embodiment of the present invention.

In an embodiment, the bridge electrode 30 may include openings as illustrated in FIG. 3. In this case, an area of the bridge electrode 30 may be decreased to improve flexibility of the touch sensor and reduce visibility of the electrode patterns.

Figure 6:
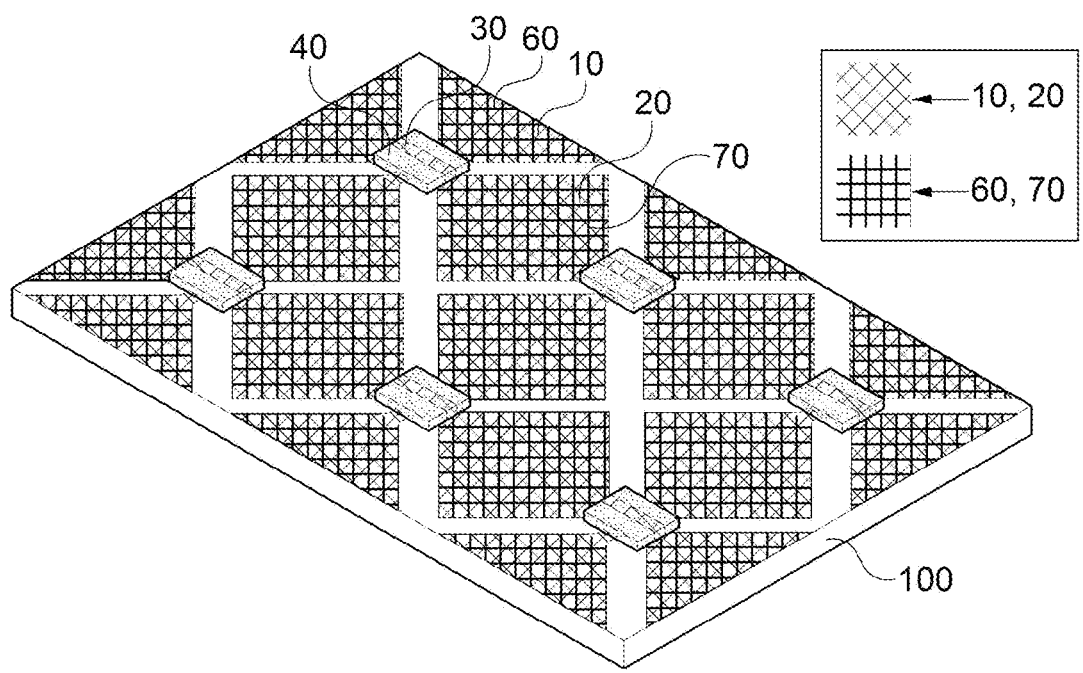
FIG. 6 is a schematic perspective view of a touch sensor according to one embodiment of the present invention.

Further, the bridge electrode 30 may have a mesh structure as illustrated in FIG. 6. In this case, the area of the bridge electrode 30 may be also decreased to improve the flexibility of the touch sensor.

Figure 4:
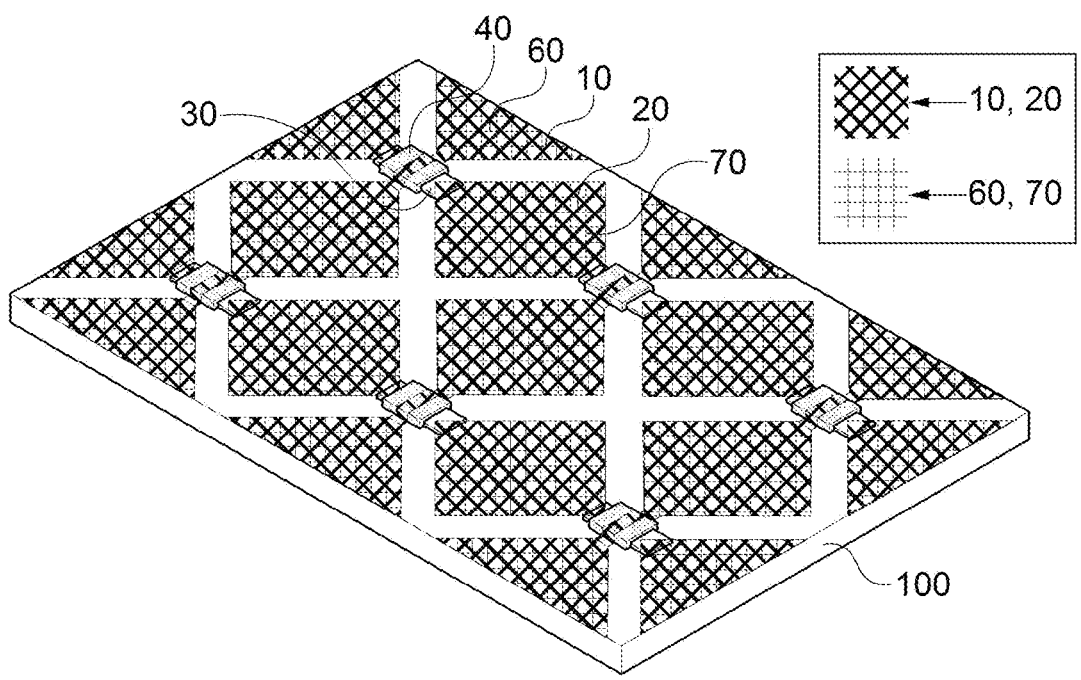
FIG. 4 is a schematic perspective view of a touch sensor according to one embodiment of the present invention.

In the touch sensor of the present inventive concepts, a laminating order of the sensing patterns and the bridge electrodes 30 is not particularly limited. For example, as illustrated in FIG. 1, the bridge electrodes 30 may be positioned on an upper side of the sensing pattern, and as illustrated in FIG. 4, the bridge electrodes 30 may be positioned on a lower side of the sensing pattern.

For example, the bridge electrode 30 may be formed by the method of forming the sensing pattern described above.

The insulation layer 40 may be disposed between the sensing pattern and the bridge electrode 30 to insulate the first mesh pattern 10 and second mesh pattern 20 from each other.

Figure 5:
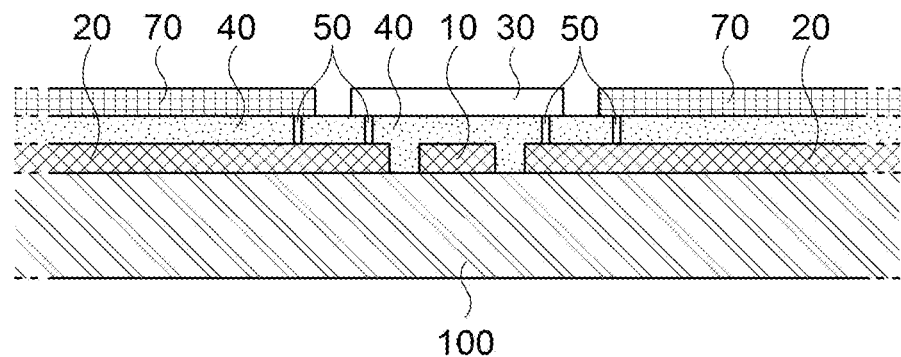
FIG. 5 is an enlarged cross-sectional view illustrating a bridge electrode in a touch sensor according to one embodiment of the present invention.

The insulation layer 40 may be positioned selectively at an intersection area of the sensing patterns and the bridge electrode 30 in an island form as illustrated in FIG. 2, and may be formed as a continuous layer as illustrated in FIG. 5.

If the insulation layer 40 is positioned in the island form, the second mesh pattern 20 may be directly connected with the bridge electrode 30. If the insulation layer 40 is positioned in the continuous layer form, the second mesh pattern 20 may be connected with the bridge electrode 40 through a contact hole 50 formed in the insulation layer 40.

The insulation layer 40 may be formed using a material and a method commonly used in the related art without particular limitation thereof.

The touch sensor of the present inventive concepts may further include an auxiliary mesh pattern.

The auxiliary mesh pattern may be disposed on an upper or a lower side of at least one of the first mesh pattern 10 and the second mesh pattern 20, and may be connected to at least one of the first mesh pattern 10 and the second mesh pattern 20.

The auxiliary mesh pattern may be connected to at least one of the first mesh pattern 10 and the second mesh pattern 20. Positional information of the contact point may be transferred to a driving circuit through the auxiliary mesh pattern even when the mesh pattern of the sensing pattern may be disconnected, so that the touch sensitivity may be remarkably improved. Further, resistance of the sensing patterns may be reduced, and thus the sensing patterns may be formed in a thinner thickness. Therefore, the sensing patterns may be prevented from being viewed due to the thinner thickness.

Further, the auxiliary mesh pattern may be capable of reducing moiré of the touch sensor.

Generally, the user may recognize moiré phenomenon due to a combination of the regular mesh pattern shape in the touch sensor. However, when the auxiliary mesh patterns are formed on the upper or lower side of the sensing patterns, irregularity of the patterns may occur, so that the moiré phenomenon may be avoided or reduced.

The auxiliary mesh patterns may include a first auxiliary mesh pattern 60 which may be disposed on the upper or lower side of the first mesh pattern to be connected to the first mesh pattern 10, and a second auxiliary mesh pattern 70 which may be disposed on the upper or lower side of the second mesh pattern 20 to be connected to the second mesh patterns 20.

FIG. 1 illustrates a case in which the first auxiliary mesh pattern 60 is formed on the upper side of the first mesh patterns 10 and the second auxiliary mesh pattern 70 is formed on the upper side of the second mesh pattern 20. FIG. 4 illustrates a case in which the first auxiliary mesh patterns 60 is formed on the lower side of the first mesh pattern 10 and the second auxiliary mesh pattern 70 is formed on the lower side of the second mesh pattern 20.

A width of the auxiliary mesh pattern is not particularly limited and may be, for example, 1 to 30 μm, and preferably 1 to 20 μm. If the auxiliary mesh pattern has a width of 1 to 30 μm, visibility of patterns may be reduced while having a proper electrical resistance. The width of the auxiliary mesh pattern may be appropriately adjusted in consideration of the electric conductivity and visibility within the above range.

A thickness of the auxiliary mesh pattern is not particularly limited, and may be, for example, 10 to 350 nm. If the thickness of the auxiliary mesh pattern is less than 10 nm, electrical resistance may be increased to reduce touch sensitivity. If the thickness exceeds 350 nm, a reflectivity may be increased to cause the visibility of patterns.

Any transparent electrode material well-known in the related art may be used for the auxiliary mesh pattern without particular limitation thereof. For example, indium-tin oxide (ITO), indium-zinc oxide (IZO), zinc oxide (ZnO), indium-zinc-tin oxide (IZTO), cadmium-tin oxide (CTO), poly(3,4-ethylenedioxythiophene) (PEDOT), carbon nanotube (CNT), graphene, etc., may be used. These may be used alone or in a combination thereof. Preferably, indium-tin oxide (ITO) may be used. A metal having improved electric conductivity and low resistance may be also used. For example, the auxiliary mesh pattern may be formed of molybdenum, silver, aluminum, copper, palladium, gold, platinum, zinc, tin, titanium, chromium, nickel, tungsten or an alloy thereof.

Preferably, the auxiliary mesh pattern may be formed of the same material as that of the bridge electrode 30. If the auxiliary mesh pattern is formed on the same side as that of the bridge electrode 30 using the same material, the auxiliary mesh pattern may be formed simultaneously formed in a single process together with the bridge electrode 30.

The auxiliary mesh pattern may be formed on the same side as that of the bridge electrode 30 based on the sensing patterns, as illustrated in FIG. 1. In this case, the auxiliary mesh pattern may be formed in the single process together with the bridge electrode 30, so that a fabricating process may be simplified.

When the insulation layer 40 has an island shape, the auxiliary mesh pattern may be directly connected with the sensing pattern. When the insulation layer 40 has a continuous layer shape, the auxiliary mesh pattern may be connected with the sensing pattern through the contact hole 50, as illustrated in FIG. 5.

The number and position of the contact holes 50 are not particular limited. A plurality of contact holes 50 may be formed throughout an entire touch area in an aspect of improving the touch sensitivity. However, since the contact holes 50 may be viewed by the user, the contact holes 50 may be densely formed in a region in which electric fields are concentrated (for example, in the vicinity of a contact area between the first mesh pattern 10 and the bridge electrode 30), and may be dispersedly throughout an entire touch area.

The first mesh pattern 10 and the second mesh pattern 20 are insulated from each other, so that the first auxiliary mesh patterns 60 and the second auxiliary mesh pattern 70 may be also insulated from each other. Similarly, the first auxiliary mesh pattern 60 may be also insulated from the bridge electrode 30.

The second auxiliary mesh patterns 70 may be connected with each other through the bridge electrode 30. In this case, a resistance of the bridge electrode 30 may be reduced.

For example, the auxiliary mesh pattern may be formed by substantially the same method as that for the sensing pattern as described above.

The touch sensor of the present inventive concepts may be disposed on a substrate 100.

For example, the substrate 100 may include glass, polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate (CAP), or the like, may be used.

While preferred embodiments have been described to more concretely understand the present, however, it will be apparent to those skilled in the related art that such embodiments are provided for illustrative purposes without limitation of appended claims, various modifications and alterations may be possible without departing from the scope and spirit of the present invention, and such modifications and alterations are duly included in the present invention as defined by the appended claims.

What is claimed is:

1. A touch sensor comprising:
   a sensing pattern comprising a first mesh pattern having a plurality of first unit patterns formed in a first direction and a second mesh pattern formed in a second direction which is different from the first direction, the second mesh pattern comprising a plurality of second unit patterns separated from each other;
   a bridge electrode connecting the neighboring unit patterns of the second mesh pattern;
   an insulation layer disposed between the sensing pattern and the bridge electrode; and
   a first auxiliary mesh pattern on or below each of the first unit patterns, and a second auxiliary mesh pattern on or below each of the second unit patterns, the first auxiliary mesh pattern and the second auxiliary mesh pattern separately connected to the first mesh pattern and the second mesh pattern,
   wherein the auxiliary mesh pattern is formed on a touch area, and the auxiliary mesh pattern transfers a touch contact signal even when the first mesh pattern or the second mesh pattern is disconnected; and the first mesh pattern and the second mesh pattern are formed at a same level on the same side of a layer.

2. The touch sensor according to claim 1, wherein the sensing pattern includes at least one selected from the group consisting of molybdenum, silver, aluminum, copper, palladium, gold, platinum, zinc, tin, titanium, chromium, nickel, tungsten, an alloy thereof, indium-tin oxide (ITO), indium-zinc oxide (IZO), zinc oxide (ZnO), indium-zinc-tin oxide (IZTO), cadmium-tin oxide (CTO), copper oxide (CO), poly(3,4-ethylenedioxythiophene) (PEDOT), carbon nanotube (CNT) and graphene.

3. The touch sensor according to claim 1, wherein the sensing pattern has a thickness of 10 to 350 nm.

4. The touch sensor according to claim 1, wherein the bridge electrode includes at least one selected from the group consisting of molybdenum, silver, aluminum, copper, palladium, gold, platinum, zinc, tin, titanium, chromium, nickel, tungsten, an alloy thereof, indium-tin oxide (ITO), indium-zinc oxide (IZO), zinc oxide (ZnO), indium-zinc-tin oxide (IZTO), cadmium-tin oxide (CTO), copper oxide (CO), poly(3,4-ethylenedioxythiophene) (PEDOT), carbon nanotube (CNT) and graphene.

5. The touch sensor according to claim 1, wherein both the auxiliary mesh pattern and the bridge electrode are disposed on the sensing pattern, or both the auxiliary mesh pattern and the bridge electrode are below the sensing pattern.

6. The touch sensor according to claim 5, wherein the auxiliary mesh pattern and the bridge electrode are formed of the same material simultaneously in a single process.

7. The touch sensor according to claim 1, wherein the bridge electrode has a mesh structure.

8. The touch sensor according to claim 1, wherein the bridge electrode includes an opening.

9. The touch sensor according to claim 1, wherein the bridge electrode includes two or more bridges.

10. The touch sensor according to claim 1, wherein the insulation layer has a continuous layer shape, and the auxiliary mesh pattern is connected with the sensing pattern through a contact hole formed in the insulation layer.

11. The touch sensor according to claim 1, wherein the insulation layer has an island shape selectively formed at an intersection region of the sensing pattern and the bridge electrode, and the auxiliary mesh pattern is directly connected to at least one of the first mesh pattern and the second mesh pattern.

12. The touch sensor according to claim 1, wherein the first auxiliary mesh pattern and the second mesh pattern are insulated from each other.

13. The touch sensor according to claim 1, wherein the second auxiliary mesh pattern comprises a plurality of the second auxiliary mesh patterns connected with each other through the bridge electrode.

* * * * *